(12) United States Patent
Kim et al.

(10) Patent No.: US 8,785,081 B2
(45) Date of Patent: Jul. 22, 2014

(54) MASK FOR LASER INDUCED THERMAL IMAGING AND METHOD OF FABRICATING ORGANIC ELECTRO-LUMINESCENCE DISPLAY DEVICE USING THE SAME

(75) Inventors: Do-Young Kim, Yongin (KR);
Young-Gil Kwon, Yongin (KR);
Seung-Mook Lee, Yongin (KR);
Dae-Hoon Kim, Yongin (KR); Sun-Hoe Kim, Yongin (KR); Min-Chul Suh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 251 days.

(21) Appl. No.: 13/024,271

(22) Filed: Feb. 9, 2011

(65) Prior Publication Data

US 2011/0195352 A1    Aug. 11, 2011

(30) Foreign Application Priority Data

Feb. 11, 2010   (KR) .................. 10-2010-0012918

(51) Int. Cl.
*G03F 1/00*            (2012.01)
(52) U.S. Cl.
USPC ............................................................ 430/5
(58) Field of Classification Search
None
See application file for complete search history.

(56) References Cited

U.S. PATENT DOCUMENTS 5,387,484 A * 2/1995 Doany et al. ...................... 430/5

FOREIGN PATENT DOCUMENTS

| JP | 56-088319 A | * | 7/1981 |
| JP | 64-087169 | | 3/1989 |
| JP | 3-258481 A | * | 11/1991 |
| JP | 05-245664 | | 9/1993 |
| JP | 07-191448 | | 7/1995 |
| JP | 07-323387 | | 12/1995 |
| JP | 08-334608 | | 12/1996 |
| JP | 2001-155366 | | 6/2001 |
| JP | 2002-011589 | | 1/2002 |
| JP | 2005-215642 | | 8/2005 |
| JP | 3886388 | | 12/2006 |
| JP | 2009-093984 | | 4/2009 |
| KR | 10-0660671 | | 12/2006 |

* cited by examiner

*Primary Examiner* — John A. McPherson
(74) *Attorney, Agent, or Firm* — Christie, Parker & Hale, LLP (57) ABSTRACT

A mask for laser induced thermal imaging and a method of fabricating an organic electro-luminescence display device using the mask. A mask includes a transparent substrate including a transmitting region; a reflective layer pattern on a first surface of the transparent substrate other than the transmitting region; and a scattering unit on at least one of the first surface or a second surface opposite the first surface of the transparent substrate, and the scattering unit is at a position corresponding to the reflective layer pattern. The mask can accurately irradiate a laser to a donor substrate and prevent or reduce damage of the laser generator due to the laser beam being reflected by the mask.

5 Claims, 7 Drawing Sheets

MASK FOR LASER INDUCED THERMAL IMAGING AND METHOD OF FABRICATING ORGANIC ELECTRO-LUMINESCENCE DISPLAY DEVICE USING THE SAME

CROSS-REFERENCE TO RELATED APPLICATION

This application claims priority to and the benefit of Korean Patent Application No. 10-2010-0012918 filed in the Korean Intellectual Property Office on Feb. 11, 2010, the entire content of which is incorporated herein by reference.

BACKGROUND

1. Field

Aspects of embodiments of the present invention relate to a mask for laser induced thermal imaging and a method of fabricating an organic electro-luminescence display device, and more particularly, to a mask for laser induced thermal imaging capable of preventing or substantially preventing damage of a laser generator due to a laser beam reflected by the mask.

2. Description of the Related Art

Generally, as a flat display device, an organic electro-luminescence device includes an anode electrode, a cathode electrode, and organic layers interposed between the anode electrode and the cathode electrode. The organic layers at least include an emission layer and may further include a hole injection layer (HIL), a hole transport layer (HTL), an electron transport layer (ETL), and an electron injection layer (EIL) besides the emission layer. The organic electro-luminescence device may be classified as a high molecular organic electro-luminescence device or a low molecular organic electro-luminescence device according to a material forming the organic layer, in particular, the emission layer.

In the organic electro-luminescence device, in order to implement a full color, the emission layer should be patterned. As a method for patterning the emission layer, there is a method of using a shadow mask in the case of the low molecular organic electro-luminescence device and a method of ink-jet printing or laser induced thermal imaging (hereinafter, referred to as LITI) in the case of the high molecular organic electro-luminescence device. Among these, there are advantages in that the LITI can finely pattern the organic layer, be used in a large area, and achieve high resolution. Further, the ink-jet printing uses a wet process, while there is an advantage in that the LITI uses a dry process.

Figure 1:
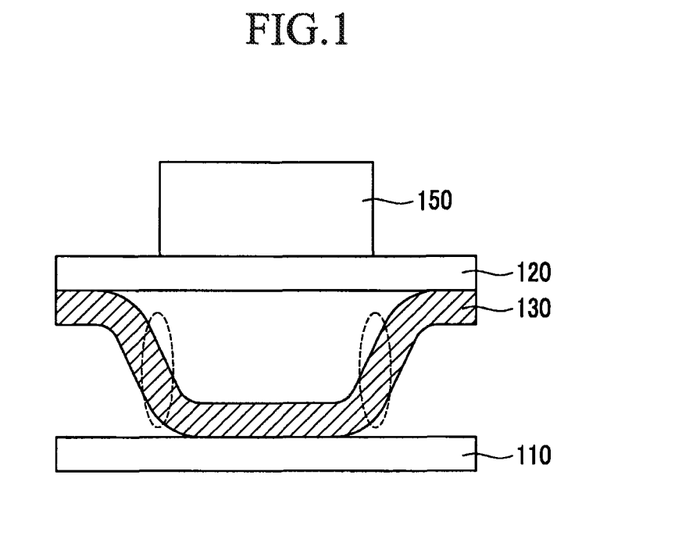
FIG. 1 is a schematic cross-sectional view for illustrating a method for forming an organic layer pattern using LITI.

FIG. 1 is a schematic cross-sectional view for illustrating a method for forming a pattern of an organic layer using LITI.

Referring to FIG. 1, a donor substrate 120 on which an organic layer 130 is formed is laminated on a substrate 110 on which predetermined devices are formed. If a laser beam 150 is irradiated in a predetermined region of the donor substrate 120 on which the organic layer 130 is formed, the laser beam is absorbed into a photo-thermal converting layer of the donor substrate 120, which is in turn converted into thermal energy. Meanwhile, the organic layer 130 forming a transfer layer by the thermal energy is transferred onto the substrate 110, thereby forming the organic layer pattern. In this case, the organic layer 130 is separated from the donor substrate 120 due to the thermal energy and is transferred onto the substrate 110 while the coupling in the organic layer 130 is broken. Energy necessary to break the coupling in the organic layer 130 should be larger than energy necessary to separate and transfer the organic layer 130 from the donor substrate 120. A dotted line portion shows a portion where the coupling in the organic layer 130 is broken.

Figure 2A:
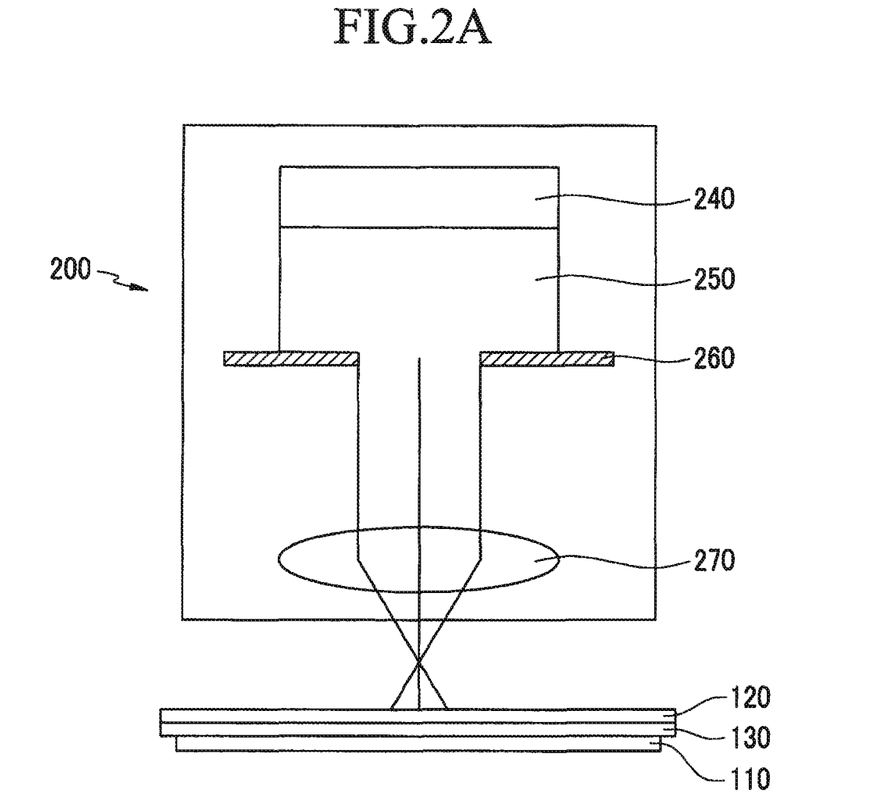
FIG. 2A is a schematic diagram for illustrating a method for fabricating an organic electro-luminescence device using a laser irradiating apparatus according to the related art.

FIG. 2A is a schematic diagram for illustrating a method for fabricating an organic electro-luminescence device using a laser irradiating apparatus according to the related art.

Referring to FIG. 2A, the donor substrate 120 on which the organic layer 130 is formed is laminated on the substrate 110 on which predetermined devices are formed. The laser irradiating apparatus 200 includes a laser generator 240, a patterned mask 260, and a projection lens 270. The laser generator 240 irradiates a laser beam 250 into the predetermined region of the donor substrate 120. In this case, the laser beam 250 irradiated from the laser generator 240 passes through the patterned mask 260, and the laser beam 250 passing through the patterned mask 260 is refracted by the projection lens 270 and is irradiated onto the donor substrate 120. The laser beam 250 is shielded in an unpatterned portion of the mask 260.

The organic layer 130 on the donor substrate 120 is transferred onto the substrate 110 by the laser beam 250. After the transfer process, the cathode electrode is formed on the formed organic layer pattern, thereby completing the organic electro-luminescence device.

Figure 2B:
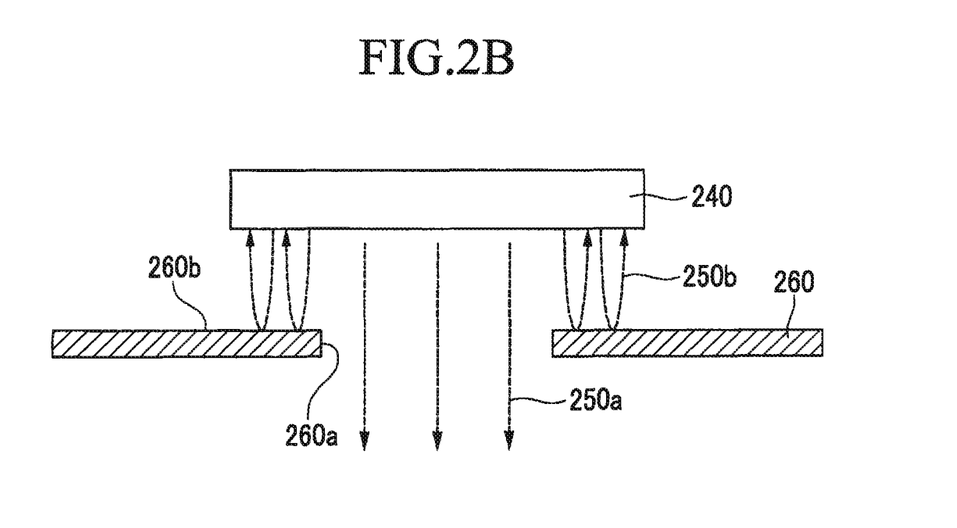
FIG. 2B is a schematic cross-sectional view for illustrating a problem of the laser irradiating apparatus according to the related art.

FIG. 2B is a schematic cross-sectional view for illustrating a problem of the laser irradiating apparatus according to the related art. Referring to FIG. 2B, the laser irradiating apparatus according to the related art passes the laser beam 250a to a patterned portion 260a of the mask 260 and transfers the organic layer 130 on the donor substrate 120 to the substrate 110 by the laser beam 250a, as described above. The laser beam 250b is reflected in an unpatterned portion 260b of the mask, i.e., in a portion where the laser beam 250 is shielded by the mask 260, and, as a result, may damage the laser generator 240.

That is, the above-mentioned mask is made of a metallic material to completely shield the laser beam 250b at the unpatterned portion 260b of the mask 260 and irradiate the laser beam 250a only at the patterned portion 260a, thereby making it possible to accurately irradiate the laser beam 250 to the donor substrate 120. However, the above-described mask 260 has a problem of damaging the laser generator 240 due to the laser beam 250b being reflected by the unpatterned portion 260b of the mask 260.

The above information disclosed in this Background section is only for enhancement of understanding of the background of the described technology and therefore it may contain information that does not form the prior art that is already known in this country to a person of ordinary skill in the art.

SUMMARY

According to an aspect of embodiments of the present invention, a mask for laser induced thermal imaging is capable of preventing or substantially preventing damage of a laser generator due to a laser beam reflected by a mask.

According to an exemplary embodiment of the present invention, a mask includes: a transparent substrate including a transmitting region; a reflective layer pattern on a first surface of the transparent substrate other than the transmitting region; and a scattering unit on at least one of the first surface or a second surface opposite the first surface of the transparent substrate, and the scattering unit is at a position corresponding to the reflective layer pattern.

According to another embodiment of the present invention, a method of fabricating an organic electro-luminescence display device includes: forming a transfer layer on a donor substrate; forming a first electrode on a substrate; aligning the donor substrate and the substrate; irradiating laser to the donor substrate by using a mask; and transferring the transfer layer on the first electrode, wherein the mask includes a transparent substrate including a transmitting region; a reflective layer pattern on a first surface of the transparent substrate other than the transmitting region; and a scattering unit on at least one of the first surface or a second surface opposite the first surface of the transparent substrate, and the scattering unit is at a position corresponding to the reflective layer pattern.

In one embodiment of a mask and a method of fabricating an organic electro-luminescence display device using the same, the scattering unit is on the second surface of the transparent substrate.

In one embodiment of a mask and a method of fabricating an organic electro-luminescence display device using the same, the scattering unit is on the first surface of the transparent substrate and the reflective layer pattern is on the scattering unit.

In one embodiment of a mask and a method of fabricating an organic electro-luminescence display device using the same, the scattering unit includes a first scattering unit on the second surface of the transparent substrate and a second scattering unit on the first surface of the transparent substrate, and the reflective layer pattern is on the second scattering unit.

In one embodiment of a mask and a method of fabricating an organic electro-luminescence display device using the same, the scattering unit includes ruggedness or protrusions and depressions.

In one embodiment of a mask and a method of fabricating an organic electro-luminescence display device using the same, the reflective layer pattern includes a metallic material.

In one embodiment of a mask and a method of fabricating an organic electro-luminescence display device using the same, the scattering unit is in a region having lower transmittance than that of the transmitting region.

In one embodiment of a mask and a method of fabricating an organic electro-luminescence display device using the same, the second surface of the transparent substrate is on a side in which a laser generator is located, and the first surface of the transparent substrate is a on a side opposite to the side in which the laser generator is located.

According to an aspect of embodiments of the present invention, a mask can accurately irradiate a laser to a donor substrate and can prevent or substantially prevent damage of a laser generator due to the laser beam being reflected by the mask.

BRIEF DESCRIPTION OF THE DRAWINGS

The above and other features and advantages of embodiments of the present invention will become more apparent to those of ordinary skill in the art by describing in detail some exemplary embodiments of the present invention with reference to the attached drawings.

DESCRIPTION OF REFERENCE NUMERALS INDICATING SOME ELEMENTS IN THE DRAWINGS 300, 400: Transparent substrate
310, 410: Reflective layer pattern
320, 420, 550b, 600b: Scattering unit
300a, 400a, 550a: Transmitting region

DETAILED DESCRIPTION

In the following detailed description, some exemplary embodiments of the present invention are shown and described, by way of illustration. As those skilled in the art would realize, the described exemplary embodiments may be modified in various ways without departing from the spirit or scope of the present invention. Rather, these exemplary embodiments are provided by way of example for understanding of the invention and to convey the scope of the invention to those skilled in the art. In the drawings, sizes and/or thicknesses of some features or components may be exaggerated for purposes of illustration. Like reference numerals designate like components throughout the specification.

Figure 3A:
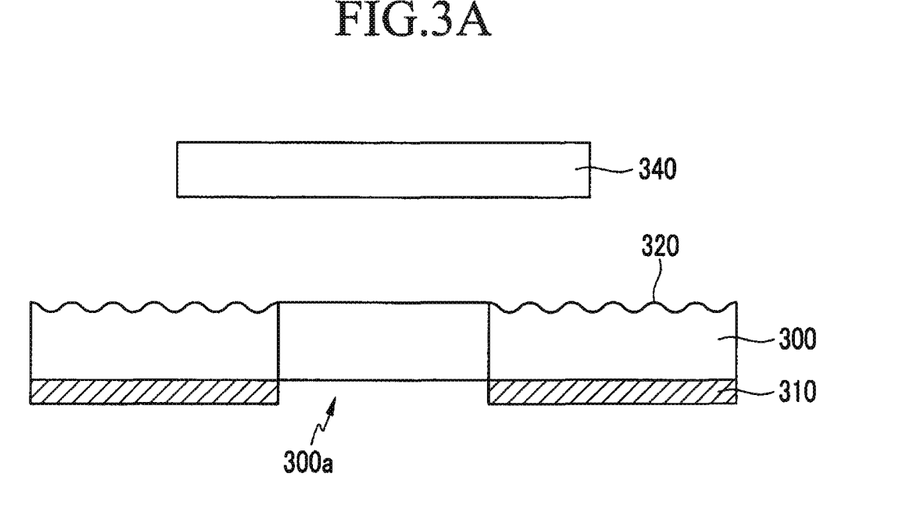
FIG. 3A is a schematic cross-sectional view showing a mask for laser induced thermal imaging according to an exemplary embodiment of the present invention.

FIG. 3A is a schematic cross-sectional view showing a mask for laser induced thermal imaging according to an exemplary embodiment of the present invention.

Referring to FIG. 3A, a mask for laser induced thermal imaging according to an exemplary embodiment includes a transparent substrate 300 and a reflective layer pattern 310 on the transparent substrate 300, and the transparent substrate 300 includes a scattering unit 320 having ruggedness or protrusions and depressions. In one embodiment, the transparent substrate 300 may be a glass substrate such as quartz that passes light therethrough, and the reflective layer pattern 310 is made of a metallic material. In detail, the reflective layer pattern 310 may be made of at least one of Ag, Mg, Al, Pt, Pd, Au, Ni, Nd, Ir, Cr, and compounds thereof by using an evaporation method, a CVD method, or a sputtering method.

In addition, the transparent substrate 300 includes a transmitting region 300a for passing a laser beam therethrough and transferring an organic layer on a donor substrate to a substrate by the laser beam. Although FIG. 3A shows that the transmitting region 300a is formed in one region, it may be formed in a plurality of regions. When the transmitting region 300a is formed in a plurality of regions, it may be formed in a stripe shape, a mosaic shape, or a delta shape, for example.

In an exemplary embodiment, the reflective layer pattern 310 is formed on the transparent substrate 300 on a surface opposite to a surface facing a side on which a laser generator 340 is disposed and is formed on the transparent substrate 300 other than the transmitting region 300a.

In addition, the scattering unit 320 is formed on the transparent substrate 300 on a surface facing a side on which the laser generator 340 is disposed and is formed on the transparent substrate 300 other than the transmitting region 300a. In an exemplary embodiment, the scattering unit 320 includes ruggedness or protrusions and depressions and corresponds to a region having transmittance lower than that of the transmitting region 300a.

Hereinafter, in one embodiment, a transparent substrate surface facing a side on which the laser generator is disposed is defined as a "front surface of a transparent substrate" and a transparent substrate surface opposite to a surface facing a side on which the laser generator is disposed is defined as a "back surface of a transparent substrate."

The mask for laser induced thermal imaging according to one exemplary embodiment is configured to include the transmitting region 300a on the transparent substrate 300 for passing the laser beam therethrough, a scattering unit 320 that is disposed on the front surface of the transparent substrate 300 other than the transmitting region 300a, and a reflective layer pattern 310 that is disposed on the back surface of the transparent substrate 300 other than the transmitting region 300a.

Figure 3B:
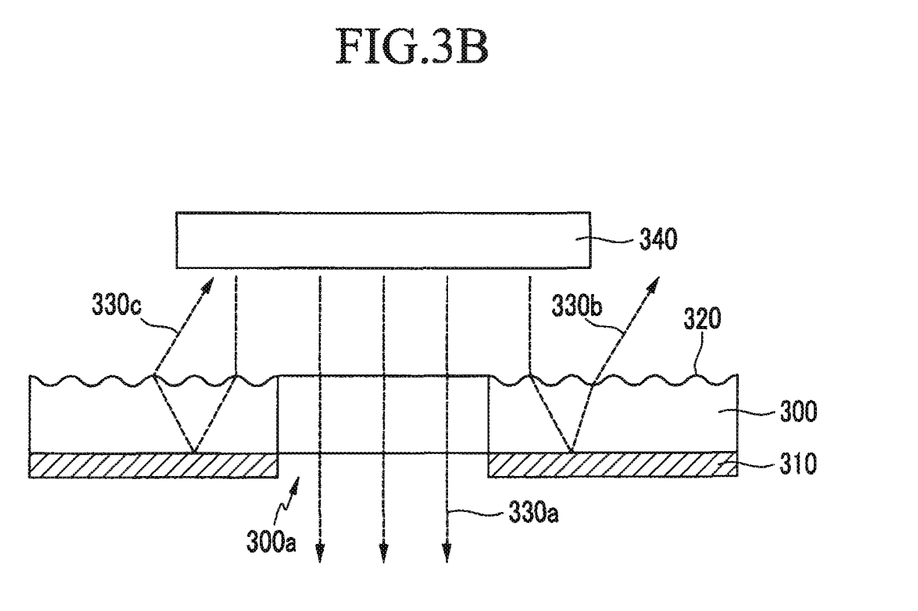
FIG. 3B is a schematic cross-sectional view for illustrating a path of a laser beam using the mask for laser induced thermal imaging of FIG. 3A.

FIG. 3B is a schematic cross-sectional view for illustrating a path of a laser beam using the mask for laser induced thermal imaging described above and shown in FIG. 3A.

Referring to FIG. 3B, the mask for laser induced thermal imaging according to an exemplary embodiment includes the transmitting region 300a on the transparent substrate 300 for passing the laser beam therethrough, the scattering unit 320 that is disposed on the front surface of the transparent substrate 300 other than the transmitting region 300a, and the reflective layer pattern 310 that is disposed on the back surface of the transparent substrate 300 other than the transmitting region 300a.

In this case, when the laser beam is irradiated from the laser generator 340, the organic layer on the donor substrate is transferred to the substrate by the laser beam 330a that passes through the transmitting region 300a.

In a region other than the transmitting region 300a, the intensity of the laser beam passing through the scattering unit 320 that corresponds to a region having transmittance lower than that of the transmitting region 300a is first weak and then, the laser beam is reflected to the scattering unit 320 side by the reflective layer pattern 310 that is disposed on the back surface of the transparent substrate 300.

In an exemplary embodiment, the scattering unit 320 includes ruggedness or protrusions and depressions, such that the laser beam passes through the scattering unit 320 in an irregular direction, and a part 330b of the laser beam is irradiated to a region which does not include the laser generator 340 and a part 330c of the laser beam is irradiated to a region which includes the laser generator 340.

In other words, the laser beam reflected by the reflective layer pattern 310 is irregularly irradiated to a side on which the laser generator 340 is disposed and a part 330b of the laser beam is irradiated to a region which does not include the laser generator 340. Therefore, the laser generator 340 is not damaged by the laser beam. Further, while the part 330c of the laser beam is irradiated to a region which includes the laser generator 340, the laser beam passing through the scattering unit 320 is weak, thereby preventing or substantially preventing damage of the laser generator.

Figure 5:
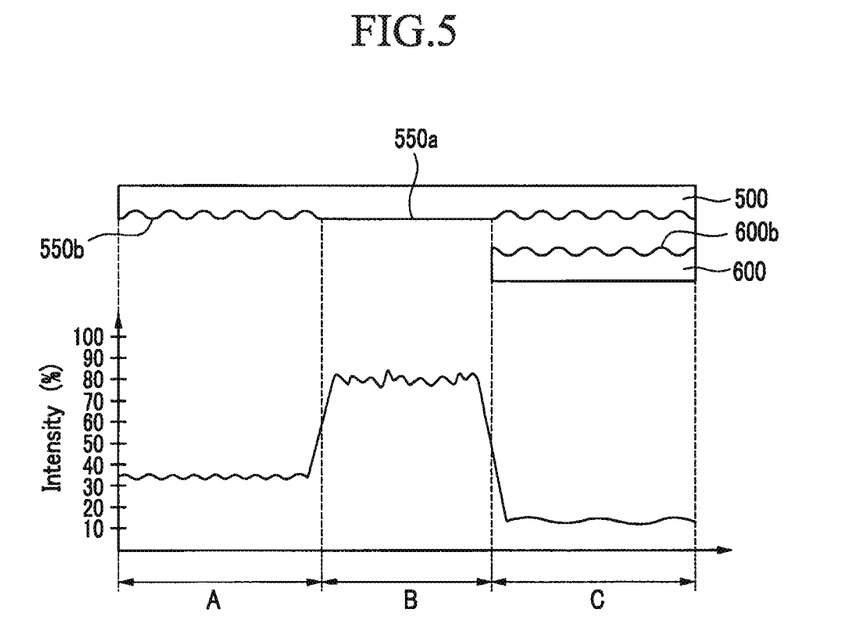
FIG. 5 is a graph showing the intensity of a laser beam according to the existence and non-existence of a scattering unit.

FIG. 5 is a graph showing the intensity of a laser beam according to the existence and non-existence of a scattering unit.

Referring to FIG. 5, the first mask 500 is configured to include a transmitting region 550a and a scattering unit 550b and the second mask 600 is configured to include a scattering unit 600b.

In this case, the scattering unit 600b of the second mask 600 overlaps with the scattering unit 550b of the first mask 500.

In other words, region "A" represents the laser beam region passing through the scattering unit 550b of the first mask 500, region "B" represents the laser beam region passing through the transmitting region 550a of the first mask 500, and region "C" represents the laser beam region passing through the scattering unit 550b of the first mask 500 and the scattering unit 600b of the second mask 600.

As can be appreciated from FIG. 5, the intensity of the laser beam that does not pass through either of the scattering units 550b, 600b and passes through only the transmitting region 550a corresponds to about 90%. However, the intensity of the laser beam passing through the scattering unit 550b of the first mask 500 is weakened to about 30% and the intensity of the laser beam passing through the scattering unit 550b of the first mask 500 and the scattering unit 600b of the second mask 600 is weakened to about 10%.

In other words, it can be appreciated that the intensity is weak in the case of the laser beam passing through one or both of the scattering units 550b, 600b. Therefore, as described above with respect to FIG. 3B, although the part 330c of the laser beam passing through the scattering unit 320 is irradiated to a region which includes the laser generator 340, the intensity is weak, thereby preventing or substantially preventing damage of the laser generator 340.

Figure 4A:
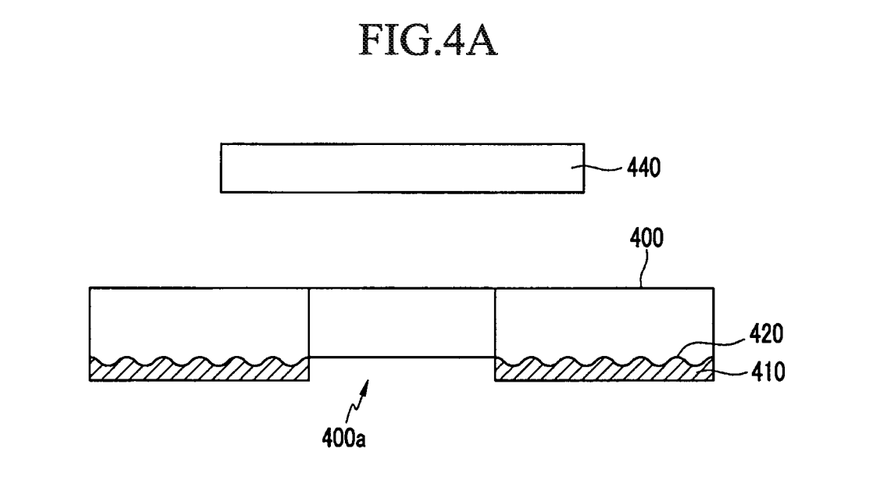
FIG. 4A is a schematic cross-sectional view showing a mask for laser induced thermal imaging according to another exemplary embodiment of the present invention.

FIG. 4A is a schematic cross-sectional view showing a mask for laser induced thermal imaging according to another exemplary embodiment of the present invention.

A mask for laser induced thermal imaging according to the embodiment of FIG. 4A may be the same as the mask for laser induced thermal imaging described above with respect to FIG. 3A except as described below.

Referring to FIG. 4A, the mask for laser induced thermal imaging according to an exemplary embodiment includes a transparent substrate 400 and a reflective layer pattern 410 on the transparent substrate 400. The transparent substrate 400 includes a scattering unit 420 that has ruggedness or protrusions and depressions.

In addition, the transparent substrate 400 includes a transmitting region 400a for passing a laser beam therethrough and transferring an organic layer on a donor substrate to a substrate by the laser beam.

In one embodiment, the reflective layer pattern 410 is formed on the transparent substrate 400 on a surface opposite to a surface facing a side on which a laser generator 440 is disposed and is formed on the transparent substrate 400 other than the transmitting region 400a.

Unlike the mask for laser induced thermal imaging as described above with respect to FIG. 3A, the scattering unit 420 is disposed on the transparent substrate 400 on a surface opposite to a surface facing a side on which the laser generator 440 is disposed and is formed on the transparent substrate 400 other than the transmitting region 400a. In an exemplary embodiment, the scattering unit 420 includes ruggedness or protrusions and depressions and corresponds to a region having transmittance lower than that of the transmitting region 400a.

Hereinafter, in the described embodiment, a transparent substrate surface on a side on which the laser generator is disposed is defined as a "front surface of a transparent substrate" and a transparent substrate surface opposite to a surface facing a side on which the laser generator is disposed is defined as a "back surface of a transparent substrate."

In other words, the mask for laser induced thermal imaging according to the exemplary embodiment of FIG. 4A is configured to include the transmitting region 400a on the transparent substrate 400 for passing the laser beam therethrough, a scattering unit 420 that is disposed on the back surface of the transparent substrate 400 other than the transmitting region 400a, and a reflective layer pattern 410 that is disposed on the scattering unit 420.

Figure 4B:
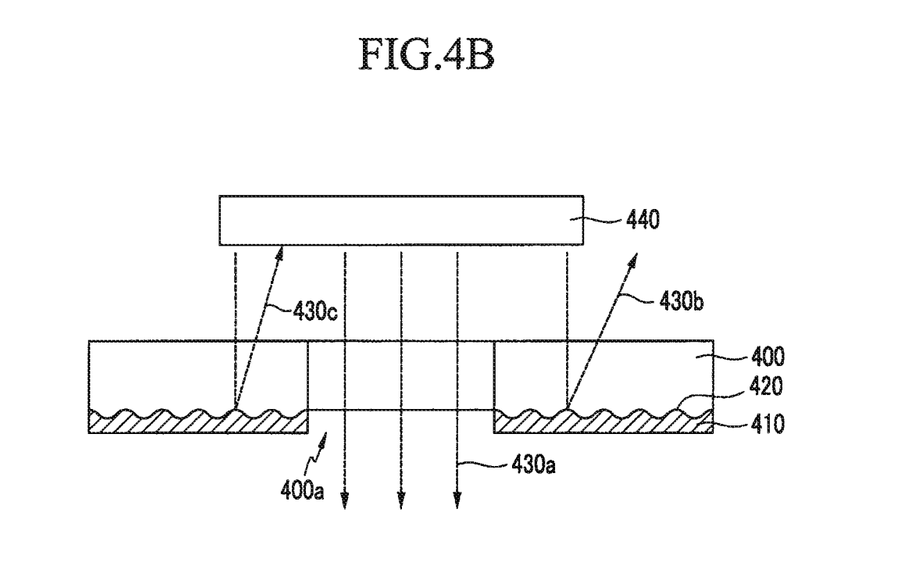
FIG. 4B is a schematic cross-sectional view for illustrating a path of laser beam using the mask for laser induced thermal imaging of FIG. 4A.

FIG. 4B is a schematic cross-sectional view for illustrating a path of a laser beam using the mask for laser induced thermal imaging described above and shown in FIG. 4A.

Referring to FIG. 4B, the mask for laser induced thermal imaging according to one exemplary embodiment includes the transmitting region 400a on the transparent substrate 400 for passing the laser beam therethrough, the scattering unit 420 that is disposed on the back surface of the transparent substrate 400 other than the transmitting region 400a, and the reflective layer pattern 410 that is disposed on the scattering unit 420.

In this case, when the laser beam is irradiated from the laser generator 440, the organic layer on the donor substrate is transferred to the substrate by the laser beam 430a that passes through the transmitting region 400a.

In a region other than the transmitting region 400a, the intensity of the laser beam passing through the transparent substrate 400 in a region having transmittance lower than that of the transmitting region 400a is first weak and then, the laser beam is reflected at the scattering unit 420 side by the reflective layer pattern 410 that is disposed on the back surface of the transparent substrate 400.

In an exemplary embodiment, the scattering unit 420 includes ruggedness or protrusions and depressions, such that the laser beam passes through the scattering unit 420 in an irregular direction and a part 430b of the laser beam is irradiated to a region which does not include the laser generator 440 and a part 430c of the laser beam is irradiated to a region which includes the laser generator 440.

In other words, the laser beam reflected by the reflective layer pattern 410 is irregularly irradiated to the side where the laser generator is disposed and a part 430b of the laser beam is irradiated to a region which does not include the laser generator 440. Therefore, the laser generator 440 is not damaged by the laser beam. Further, while the part 430c of the laser beam is irradiated to a region which includes the laser generator 440, the laser beam passing through the scattering unit 420 is weak, thereby preventing or substantially preventing damage of the laser generator 440.

Figure 6:
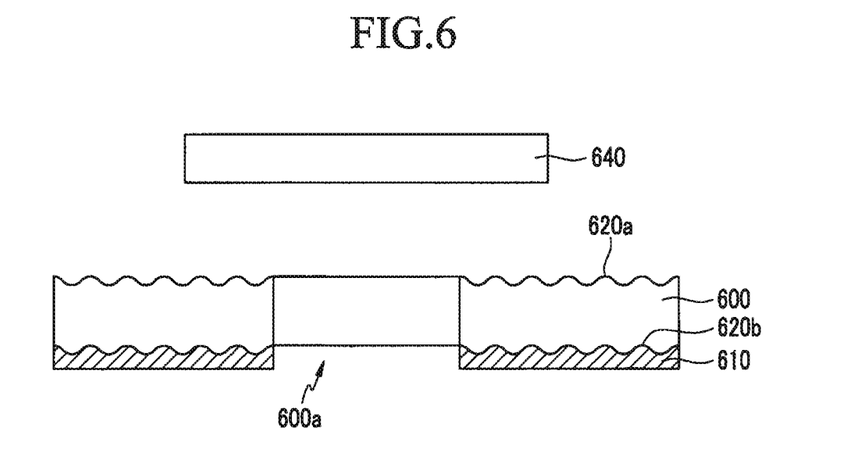
FIG. 6 is a schematic cross-sectional view showing a mask for laser induced thermal imaging according to another exemplary embodiment of the present invention.

FIG. 6 is a schematic cross-sectional view showing a mask for laser induced thermal imaging according to another exemplary embodiment of the present invention.

A mask for laser induced thermal imaging according to the embodiment of FIG. 6 may be the same as the masks for laser induced thermal imaging described above with respect to FIGS. 3A and 4A except as described below.

Referring to FIG. 6, the mask for laser induced thermal imaging according to one exemplary embodiment includes a transparent substrate 600 and a reflective layer pattern 610 on the transparent substrate 600. The transparent substrate 600 includes a scattering unit that has ruggedness or protrusions and depressions.

Further, the reflective layer pattern 610 is formed on the transparent substrate 600 on a surface opposite to a surface facing a side on which a laser generator 640 is disposed and is formed on the transparent substrate other than a transmitting region 600a.

In the mask according to the embodiment described above and shown in FIG. 3A, the scattering unit 320 is formed on the front surface of the transparent substrate 300, and in the mask according to the embodiment described above and shown in FIG. 4A, the scattering unit 420 is formed on the back surface of the transparent substrate 400. However, according to one embodiment, as shown in FIG. 6, in the scattering unit, a first scattering unit 620a is formed on the front surface of the transparent substrate 400 and a second scattering unit 620b is formed on the back surface of the transparent substrate 400.

In other words, the mask for laser induced thermal imaging according to one exemplary embodiment includes the transmitting region 600a on the transparent substrate 600 for passing a laser beam therethrough, the first scattering unit 620a that is disposed on the front surface of the transparent substrate 600 other than the transmitting region 600a, the second scattering unit 620b that is disposed on the back surface of the transparent substrate 600 other than the transmitting region 600a, and a reflective layer pattern 610 that is disposed on the second scattering unit 620b.

Therefore, in the mask for laser induced thermal imaging according to the embodiment shown in FIG. 6, the scattering unit is disposed on both the front surface and the back surface, such that the intensity of the laser beam passing through the scattering unit is weaker, thereby preventing or substantially preventing damage of the laser generator 640.

As described above according to exemplary embodiments of the present invention, the mask for laser induced thermal imaging according to one embodiment includes the reflective layer pattern on the back surface of the transparent substrate to completely shield the laser beam in a region in which the reflective layer pattern is disposed, thereby accurately irradiating the laser to the donor substrate similar to the metallic material mask in the related art and forms the scattering unit on the front surface and/or the back surface of the transparent substrate in the region corresponding to the reflective layer pattern, thereby making it possible to prevent or substantially prevent damage of the laser generator due to the laser beam reflected by the mask that is a problem of the metallic material mask of the related art.

Figure 7A:
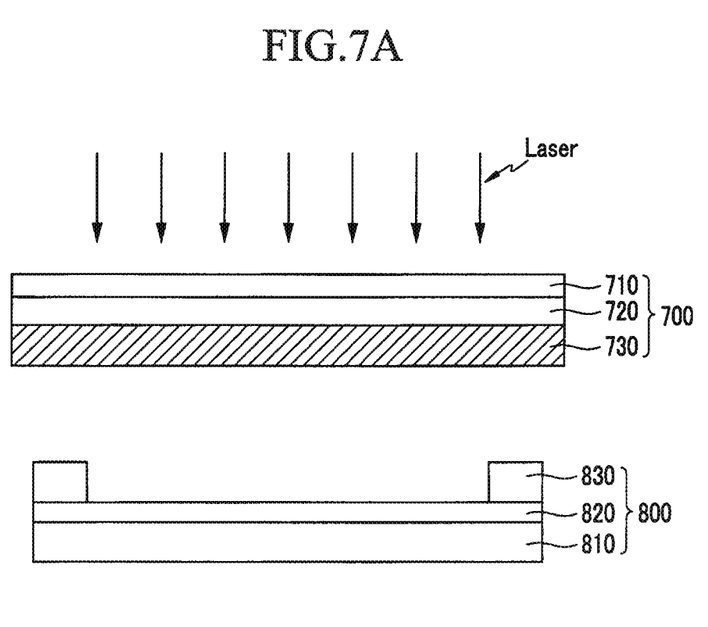
FIGS. 7A to 7C are schematic cross-sectional views for illustrating a process for manufacturing an organic electro-luminescence display device according to an exemplary embodiment of the present invention.
Figure 7B:
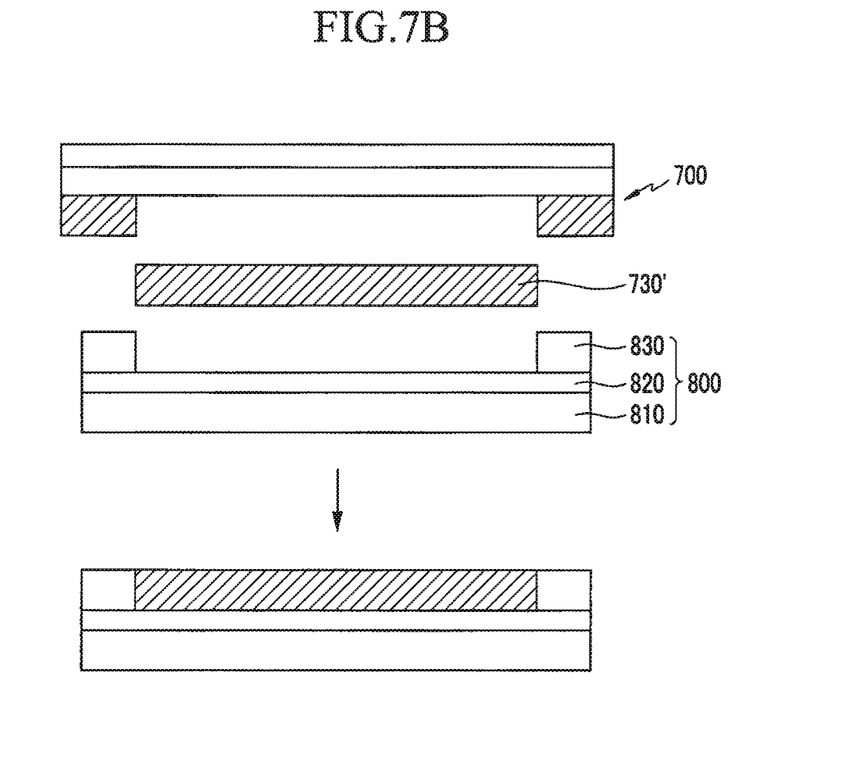
Figure 7C:
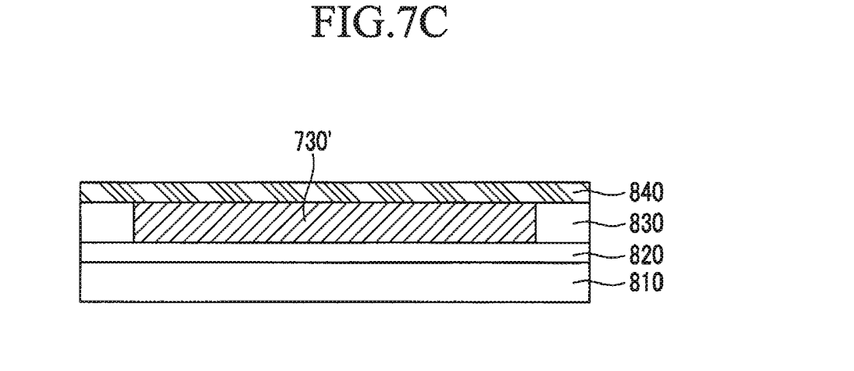

FIGS. 7A to 7C are schematic cross-sectional views for illustrating a process for manufacturing an organic electroluminescence display device according to an exemplary embodiment of the present invention.

As shown in FIG. 7A, an insulation substrate 810 is provided and a first electrode 820 is patterned and then is formed on the insulation substrate 810.

Herein, the first electrode 820 may be an anode or a cathode. If the first electrode 820 is the anode, it may be a transparent electrode made of ITO or IZO as a metal having high work function or a reflective electrode made of Pt, Au, Ir, Cr, Mg, Ag, Ni, Al, or an alloy thereof. If the first electrode 820 is a cathode, it may be a transparent electrode that is made of Mg, Ca, Al, Ag, Ba, or an alloy thereof as low work function and has a thin thickness or a thick reflective electrode.

Then, a pixel definition layer 830 that defines R, G, B pixel areas is formed to manufacture a substrate 800.

FIG. 7A shows one sub-pixel of the organic electro-luminescence device, wherein the above-mentioned sub-pixels may be aligned in plural. Although not shown in FIG. 7A, the substrate 800 may include the plurality of thin film transistors and the insulation layer.

A photo-thermal converting layer 720 and a transfer layer 730 are sequentially stacked on a base layer 710 to manufacture the donor substrate 700. Herein, the transfer layer 730 may be formed by a wet process by using the organic material.

Thereafter, after the pixel area of the substrate 800 and the transfer layer 730 of the donor substrate 700 are aligned to face each other, a laser is irradiated to a region to be transferred to the base layer 710 surface of the donor substrate 700.

A laser irradiating apparatus is used in order to irradiate the laser. Describing the laser irradiating apparatus with reference to FIG. 2A, the laser irradiating apparatus includes a laser generator, a mask and a projection lens. The laser generator irradiates a laser beam to a predetermined region of the donor substrate 700. In this case, the laser beam irradiated from the laser generator passes through the patterned mask and the laser beam passing through the patterned mask is refracted by the projection lens and is irradiated on the donor substrate 700.

In this case, as the mask, the mask according to one of the exemplary embodiments described above is used and the laser beam irradiated on the donor substrate 700 corresponds to the laser beam passing through the transmitting region of the mask according to one of the embodiments. This refers to the above description and, therefore, a detailed description thereof will not be repeated.

Referring to FIG. 7B, the organic transfer layer 730 on the donor substrate 700 to which the laser beam is irradiated is transferred on the substrate 800 and then, the donor substrate 700 is removed, thereby making it possible to form the organic layer pattern 730'.

Thereafter, as shown in FIG. 7C, a second electrode 840 is formed on the substrate including the organic layer pattern 730'. Herein, the second electrode may be an anode or a cathode.

If the second electrode 840 is an anode, it may be a transparent electrode made of ITO or IZO as a metal having high work function or a reflective electrode made of Pt, Au, Ir, Cr, Mg, Ag, Ni, Al, or an alloy thereof.

If the second electrode 840 is a cathode, it may be formed of a transparent electrode made of Mg, Ca, Al, Ag, or an alloy thereof as a conductive metal having low work function and has a thin thickness or a reflective electrode having a thick thickness.

Then, it seals a sealing material such as the upper metal can, thereby making it possible to manufacture the organic electro-luminescence display device.

While this disclosure has been described in connection with some exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask comprising:
a transparent substrate including a transmitting region having a first transmittance, and another region having a second transmittance less than the first transmittance;
a reflective layer pattern on a first surface of the transparent substrate other than the transmitting region; and
wherein the transparent substrate includes a scattering unit including ruggedness or protrusions and depressions on the first surface of the transparent substrate,
wherein the scattering unit is at a position corresponding to the reflective layer pattern, and
wherein the reflective layer pattern is on the scattering unit.

2. The mask of claim 1, wherein the reflective layer pattern comprises a metallic material.

3. The mask of claim 1, wherein the scattering unit is in the another region having the second transmittance less than the first transmittance of the transmitting region.

4. The mask of claim 1, wherein the second surface of the transparent substrate is on a side in which a laser generator is located, and the first surface of the transparent substrate is on a side opposite to the side in which the laser generator is located.

5. A mask comprising:
a transparent substrate including a transmitting region;
a reflective layer pattern on a first surface of the transparent substrate other than the transmitting region; and
a scattering unit comprising a first scattering unit on a second surface opposite the first surface of the transparent substrate and a second scattering unit on the first surface of the transparent substrate,
wherein the scattering unit is at a position corresponding to the reflective layer pattern, and
wherein the reflective layer pattern is on the second scattering unit.

* * * * *